United States Patent [19]

Cheype et al.

[11] 4,038,744
[45] Aug. 2, 1977

[54] METHODS OF MANUFACTURING CARRIER SUPPORTS FOR INTEGRATED CHIPS AND MOUNTING OF INTEGRATED CIRCUIT CHIPS TO A SUBSTRATE

[75] Inventors: Jean Marie Cheype, Gagny; Patrick Courant, Paris; Karel Kurzweil, Eaubonne, all of France

[73] Assignee: Compagnie Honeywell Bull (Societe Anonyme), Paris, France

[21] Appl. No.: 680,749

[22] Filed: Apr. 27, 1976

[30] Foreign Application Priority Data

May 13, 1975  France ............... 75.14872

[51] Int. Cl.² .............................................. H01R 9/00
[52] U.S. Cl. .................................. 29/630 A; 29/628; 29/590; 427/96
[58] Field of Search ............ 29/625, 626, 628, 576 S, 29/630 A, 630 B, 630 C, 630 D, 590, 588; 174/52 FP; 357/70; 427/96

[56] References Cited

U.S. PATENT DOCUMENTS

3,868,724  2/1975  Perrino ................................. 357/70

OTHER PUBLICATIONS

IBM Technical Disclosure Bulletin, vol. 13, No. 7, Dec. 1970, p. 2099.

*Primary Examiner*—Lowell A. Larson
*Attorney, Agent, or Firm*—Cameron, Kerkam, Sutton, Stowell & Stowell

[57] ABSTRACT

A method of fabricating a carrier support for integrated circuit chips to be mounted subsequently on a substrate. A flexible strip of an inextensible insulating material is provided with equidistant openings in the center of each of which a chip is to be mounted. One of the faces of this strip is covered with a conductive film, the said film is cut away to form in each opening interface conductors which overhang towards the center of the opening. Before the conductive film is cut away, the film is coated with a layer of photosensitive lacquer which is partly removed to enable the film to be laid bare in regions which, in each opening, form part of an open-centered zone which surrounds that portion of the film in which the free inner ends of the interface conductors associated with this opening are to be produced. The bared regions in this opening either consist of the whole of the said open-centered zone or else consist of those portions of the zone which are located at least at the points where the said zone is crossed by the outlines of the future interface conductors associated with this opening. A layer of synthetic resin electrodeposited on the bared regions of the film and thereafter the remaining portions of the photosensitive lacquer are removed, as a result of which there is no danger of the interface conductors resulting from the film being cut away causing short circuits when, after the chips have been mounted on their free inner ends, the conductors are cut at a short distance from the edges of each chip so that they may finally be soldered to the said substrate.

13 Claims, 14 Drawing Figures

METHODS OF MANUFACTURING CARRIER SUPPORTS FOR INTEGRATED CHIPS AND MOUNTING OF INTEGRATED CIRCUIT CHIPS TO A SUBSTRATE

The present invention relates to improvements in methods of manufacturing carrier supports for integrated circuit chips.

In the well-known technique of producing integrated circuits, a wafer cut from a monocrystal of a semiconductor material, such as silicon, is subjected to series of operations consisting of doping, masking, photo-etching and the ionic diffusion or implantation of doping impurities, this forming within the wafer a plurality of identical, regularly distributed integrated circuits. The processed wafer is then coated with a protective insulating layer, of glass for example, and cut up into chips, each chip containing one individual set of integrated circuits. Each chip is provided with contact regions which are arranged in a predetermined pattern. Electrical connections between each chip and an interconnecting support such as a printed circuit board are provided by means of interface conductors soldered to the associated chip or chips, as the case may be. The interconnecting support is commonly referred to as a substrate.

The chips are of very small dimensions and to make them less awkward to handle and easier to mount on a substrate, it has been proposed that they should be attached to a flexible strip of an inextensible insulating material which is provided with regularly spaced lateral perforations to allow it to be moved along and with equidistant openings to allow the chips to be mounted on it. Towards the centers of these openings extend overhanging interface conductors which are the result of cutting away a film of a conductive substance which is formed on one of the faces of the strip. In each opening, the disposition of the free inner ends of the interface conductors matches that of the contact regions on a chip which is located in the center of the opening. This being the case, the chips are mounted on the strip by positioning them under respective ones of the openings in the strip in such a way that the contact regions on the chips line up with respective ones of the inner ends of the interface conductors in the opening concerned, and then soldering these ends to the said contact regions.

The chips which have been mounted on the strip in this way may then be attached to the substrate such as a printed circuit board. To this end, the interface conductors, whose inner ends are soldered to the contact regions on an integrated circuit chip, are cut at a short distance from the edges of the chip. Having been separated from the strip in this way, the non-active face of the chip is then soldered (i.e. the face which does not have contact regions) to a die bonding pad on the substrate. After this, the ends of the portions of the interface conductors which remain overhanging from the chip are bent, to bring them into contact with the corresponding conductive areas on the substrate and to enable them to be soldered thereto. In the course of this operation, the ends of the portions of the interface conductors are thus subjected to deformation which, particularly in cases where the contact regions are relatively far away from the edges of the chip, may bring them into contact with the edges of the chip. If the protective insulating layer covering the active face of the chip has flaked away along the edges of the chip when the wafer was cut up, a short-circuit may occur between the uninsulated edge of the chip and the portion of conductor which has been brought into contact with it.

To overcome this drawback, a method has been proposed in the prior art which consists in forming on the active or operative face of the wafer, before it is coated with the protective insulating layer, U-shaped dividing grooves which are wider than the sawcuts which are made when the wafer is cut up into chips. The result is that the upper edges of the chips produced by the cutting operation have a kind of bevelled appearance, which reduces the risks of a portion of conductor coming into contact with one of the edges of the chip to which it has been soldered. However, such a method has other drawbacks. In effect, even with the bevelled edges it is difficult to prevent the protective layer from flaking when the wafer is cut up and in the end this means that it is a mistake to think of the protective layer as having an insulating effect at all. Furthermore, given on the one hand that the insulating material, which is vapour deposited on the wafer after the parting grooves have been made, builds up to a lesser extent in the grooves than on the other parts of the wafer, and on the other hand that the thickness of the insulating layer is necessarily restricted by the height of the contact regions which project from the active face of the wafer, it is very difficult to provide any effective protection for the edges of the chips produced by cutting up the wafer. In the absence of such protection, there is a constant danger of short-circuits along these edges.

It is for this reason, and to obviate all these drawbacks, that it has been found preferable to arch the interface conductors on the strip, that is to say to deform them relative to the plane of the strip in such a way that they cannot touch the edges of the chip to which they are soldered, even when the free ends of the portions of the conductors which remain after the conductors have been cut are bent so that they can be soldered to the conductive areas on the substrate. This arching process may take place before the chips are mounted on the strip; however, because the interface conductors are more flexible in the plane of the strip after being arched in this way, there is a danger that any one of the arched conductors, when the chips are being mounted, may slip on the contact region against which it is pressed and thus touch the adjoining region and short-circuit the two regions.

To overcome this drawback, it has been proposed that the interface conductors should not be arched until after the chips have been mounted on the strip. However, to avoid the risk of fracturing or unsoldering the conductors, it is necessary with this procedure for the interface conductors to be of a special configuration, which is described and illustrated in copending French patent application No. 1071/76 corresponding to U.S. application Ser. No. 652,803, assigned to the assignee of the present invention.

The present invention overcomes all these drawbacks and provides an easy and inexpensive method of obtaining a strip intended to carry integrated circuit chips, this strip making it possible to remove the danger of short circuits described above while avoiding the necessity of arching the interface conductors.

One aspect of the invention relates to a method of obtaining a carrier support for integrated circuit chips which are intended for subsequent mounting on a substrate. This method consists in using a flexible strip made of an inextensible insulating material provided with equidistant openings in the center of each of which a chip is to be mounted, in covering one of the faces of this strip with a film of a conductive substance, and in cutting away the said film to form in each opening interface conductors which overhang towards the center of the opening, the said method being characterised in that it further consists, before the film of conductive substance is cut away: in coating the film with a layer of photosensitive lacquer, in partly removing the said layer in order to lay bare the film in regions which, in each opening, form part of an open-centered zone surrounding that portion of the film in which the free inner ends of the interface conductors associated with this opening are to be formed, the bared regions in the opening either consisting of the whole of the said open-centered zone or else consisting of those portions of the zone which are located at least at the points where the said zone is crossed by the outlines of the future interface conductors associated with this opening, in electrodepositing a layer of synthetic resin on the regions of the film so bared, and in removing the remaining portions of photosensitive lacquer as a result of which there is no danger of the interface conductors resulting from cutting away the said film causing short-circuits when, after the chips have been mounted on the said free ends, these conductors are cut at a short distance from the edges of each chip so that they may finally be soldered to the said substrate.

BRIEF DESCRIPTION OF THE DRAWINGS

The invention will now be further described, by way of example, with reference to the accompanying drawings, in which.

DESCRIPTION OF THE PREFERRED EMBODIMENT

Figure 1:
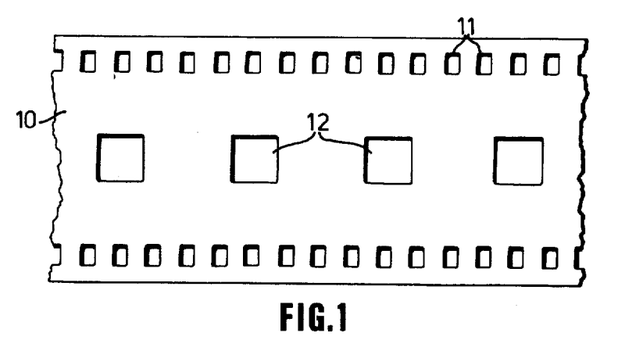
FIG. 1 is a fragmentary section of a strip of insulating material from which the carrier support for integrated circuit chips is produced.

Before describing the features of the invention, a brief summary will first be given of the way in which the support which is used to carry integrated circuit chips is usually produced. A support of this nature is produced from a strip of the type of which a fragmentary section is shown in FIG. 1. This strip, referenced 10 in FIG. 1, is formed from a flexible and inextensible insulating material which may for example be the polyimide material which is made and sold by the DuPont de Nemours Company under the name "Kapton" (registered trade mark). The strip 10 is provided on the one hand with regularly spaced lateral perforations 11 which are intended to allow the strip to be moved along by a suitable device, and on the other hand with openings 12 arranged at regular intervals along the longitudinal axis of the strip which are each intended to allow an integrated circuit chip to be mounted in them, in a way which will be described below. It should be mentioned that these openings 12 are of generous dimensions in comparison with the size of the chips which they are intended to receive. Thus, in the case of the example described, each opening is in the form of a square whose sides are approximately seven millimeters long, whereas each chip is in the form of a rectangle whose sides measure from two to three millimeters approximately.

Figure 2:
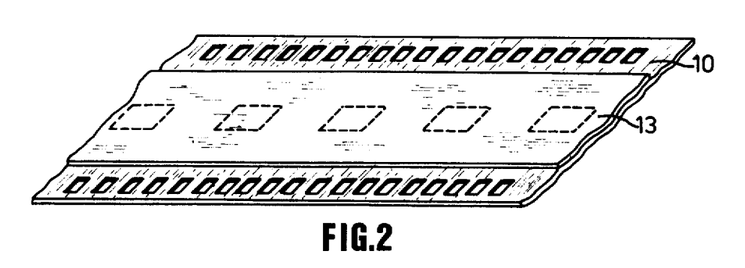
FIG. 2 shows the appearance of the strip of FIG. 1 after one of its faces has been covered with a film of a conductive substance.

The strip 10 is first covered on one of its faces with a film 13 of a conductive substance which, as FIG. 2 shows, extends over the major proportion of the area of the strip, except for two lateral zones of the strip in which the perforations 11 are formed. Film 13 thus entirely covers the openings 12 and it is formed, in the example described, by a band of copper approximately 35 microns thick which is hot-laminated to one of the faces of strip 10.

Figure 3:
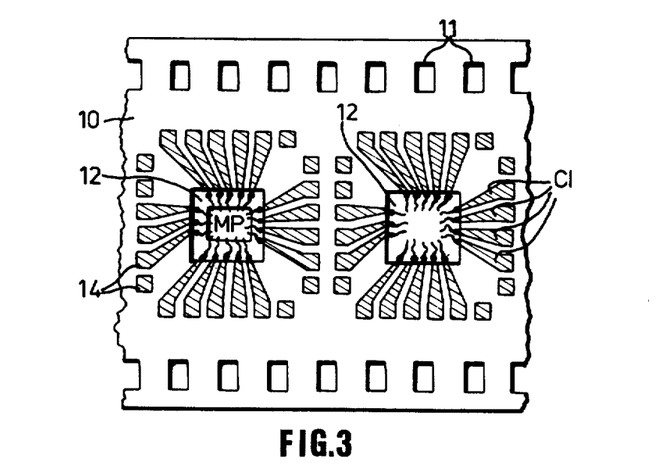
FIG. 3 shows the appearance of the strip of FIG. 2 when the film attached to it has been cut away selectively to form the interface conductors which are used to mount the integrated circuit chips.

At a later stage, film 13 will be cut away, using known techniques such as photoengraving, to produce interface conductors C1 which, as shown in FIG. 3, converge towards the centers of openings 12. The outer ends of these interface conductors as shown in FIG. 3 are so formed as to constitute contact areas 14. These contact areas are preferably arranged around each opening in a standard pattern consisting of, for example, twenty-four (4 × 6) contact areas arranged in a rectangle. Certain of the contact areas may remain unused, while the others connect to the interface conductors. It can also be seen from FIG. 3 that each of the interface conductors is partly attached to strip 10 and partly overhangs into the opening towards which it converges. The configuration of these overhanging portions may be more clearly seen in FIG. 8, which shows in detail one of the openings in the strip 10 of FIG. 3 after the strip has been turned over.

The free inner ends of the interface conductors which converge towards this opening, that is the ends 15 of their overhanging portions, are intended to be soldered to contact regions or studs on an integrated circuit chip. The inner ends 15 are disposed in each opening in such a way as to match the disposition of the contact studs on the chip which is to be mounted in the opening. This being the case, the chips are mounted on the strip by positioning them under respective ones of the openings in the strip, in such a way that the contact studs on them line up with respective ones of the inner ends 15 of the interface conductors associated with the opening in question. Then these ends 15 are soldered to the contact studs. A chip so mounted is shown by way of example in FIG. 3, the chip being identified in the Figure, with reference characters MP.

Figure 9A:
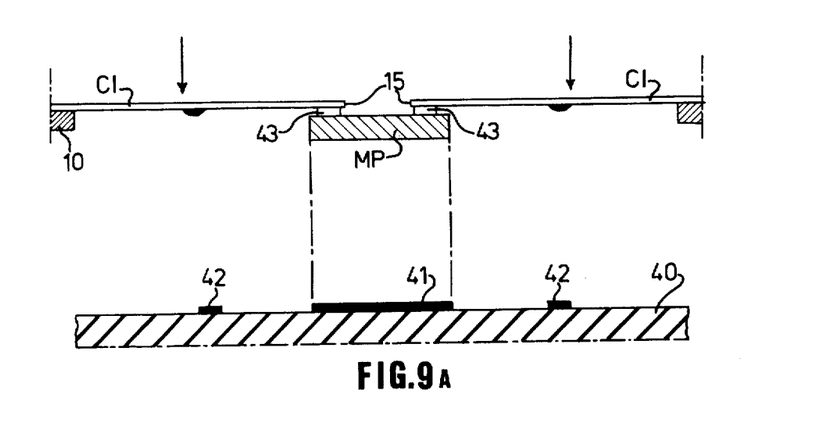
FIGS. 9A, 9B and 9C are fragmentary schematic views, partially in cross-section illustrating the method whereby integrated circuit chips which have first been mounted on a strip of the type shown in FIG. 3 may be mounted on a substrate.
Figure 9B:
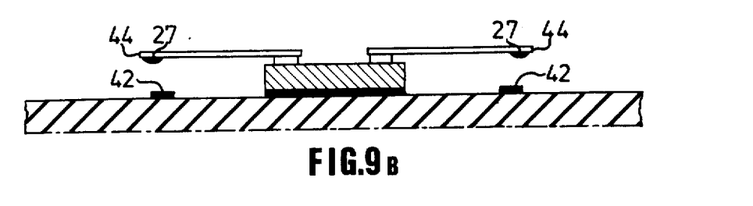
Figure 9C:
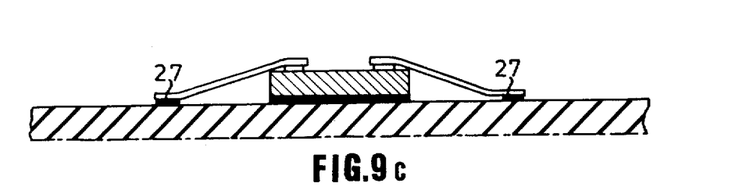

The chips which have been mounted on the strip in this way may then be attached to a substrate such as a printed circuit board. FIGS. 9A, 9B and 9C are schematic views showing the way in which this operation is performed. The substrate 40 (FIG. 9A) which is intended to receive the chips is normally provided on the one hand with die-bonding pads, one of which is shown in FIG. 9A at 41, and on the other hand with conductive areas of which two are shown in the Figure with the reference 42.

FIG. 9A shows a chip MP which has been attached to the interface conductors C1 at the center of one of the openings in strip 10. Contact studs 43 on this chip have been soldered to the inner ends 15 of the interface conductors C1 associated with this opening. To mount the chip MP on substrate 40, the substrate is first moved so that the pad 41 to which the chip is to be attached is aligned with the chip and is exactly below the chip. The overhanging portions of the interface conductors are then cut at the points indicated by the arrows in FIG. 9A. Chip MP is thus detached and then applied to pad 41, as shown in FIG. 9B, in such a way that the remaining parts of the interface conductors which are still attached to the chip extend over and above the conductive areas 42 on the substrate to which they are to be soldered. After this, the ends 44 of these portions of conductors are bent to enable them to be brought down onto areas 42 as shown in FIG. 9C, and soldered thereto.

Having been attached in this fashion to the substrate 40, the chips are finally encapsulated in a blob of polymerisable resin which, once it has set, provides effective protection for the metal parts of the chips against the corrosive effect of moisture and the various acids which are almost invariably present, even though in very small proportions, in the atmosphere.

In the method of producing the strip according to the preferred embodiment of the invention, the film 13 of conductive substance, which has been attached to one of the faces of strip 10 as shown in FIG. 2, is covered locally, before being cut away to form the interface conductors C1, with a layer of synthetic resin, whose functions will be hereinafter explained in detail. The thickness of this layer is held between 5 and 20 microns. The resin used for this covering operation is one which is selected from the group comprising the polytetrafluoroethylenes and the epoxy resins. The method of deposition which is most advantageous, due to the ease with which it can be employed, and which enables a relatively shallow layer of synthetic resin to be obtained with the possibility of adjusting the thickness with extreme accuracy, is electro-deposition. For reasons which will be hereinafter explained, it is in fact advisable for the layer to be of a uniform thickness.

Before being covered locally with the layer of synthetic resin, the film 13, which is made of copper in the example described, first undergoes a cleaning operation. This operation may consist of degreasing the surface of the copper with freon, followed by rinsing and acid etching, the film of copper 13 being then immersed, in succession, in a bath formed from a mixture of nitric acid and ammonium fluoride and a bath formed by a chromatosulphuric solution. After this the film is rinsed in acid, which is done by agitating the film in a bath formed from a mixture of hydrochloric acid and the solution which is marketed under the name "Diversey" (registered trade mark) and finally in an aqueous solution of nitric acid.

The film 13 is then dried and coated with a uniform layer of photosensitive lacquer. This lacquer may be a photosensitive lacquer which is commercially available under the name "Shipley AZ 340" (registered trade mark). Shipley AZ 340 lacquer is commercially available from the Shipley Company, Inc., while the Diversy rinse is commercially available from Diversy Company, Inc. Having been applied to the film 13, the lacquer is then dried, by infra-red radiation, for example. After drying, the strip 10 to which the film 13 is attached is inserted in an exposing apparatus to allow the photosensitive layer covering the film to be exposed to the effect of a light source through a mask which carries the design to be reproduced on the layer. An exposing apparatus which is particularly suitable for this operation is described and illustrated in particular in copending U.S. patent application Ser. No. 573,470, filed May 1, 1975 and assigned to the assignee of the present invention, now Pat. No. 3,998,369.

When the exposure is complete, the layer of photosensitive lacquer is developed and the exposed parts of the lacquer dissolved by a known process. In the example described, this operation is performed by firstly immersing the strip 10 for a time of two minutes in a bath made from a solution which is commercially available from the aforementioned Shipley Company, Inc., under the name "Shipley AZ 303 developer" (registered trademark), the composition of the bath being as follows:

Shipley AZ 303 developer . . . 1 volume
De-ionised water . . . 4 volumes

Then, after being rinsed in running water, the strip is re-immersed in this bath for two minutes. The strip, covered with its film of copper, is then rinsed and dried.

The parts of the layer of photosensitive lacquer which were subjected to exposure having been dissolved, film 13 is thus partly laid bare at selective regions. The bared regions of the film are intended to be covered with a layer of synthetic resin by electrodeposition.

Figure 4:
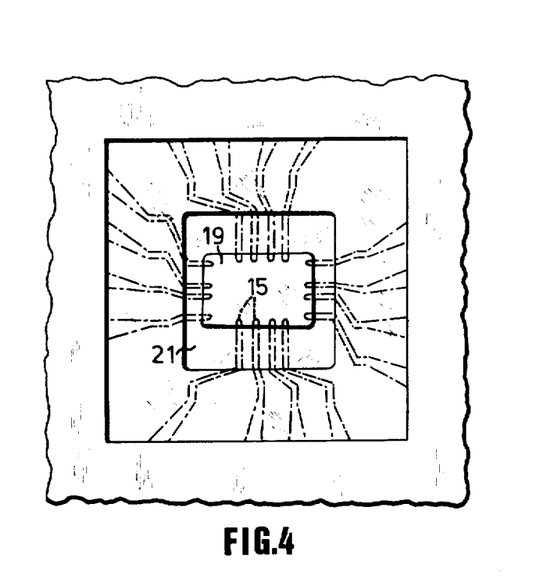
FIGS. 4 and 6 are views on a larger scale showing the appearance, at different stages, of each of the openings in the strip of FIG. 2 when the strip is processed in accordance with the inventing before the conductive film has been cut away.
Figure 5:
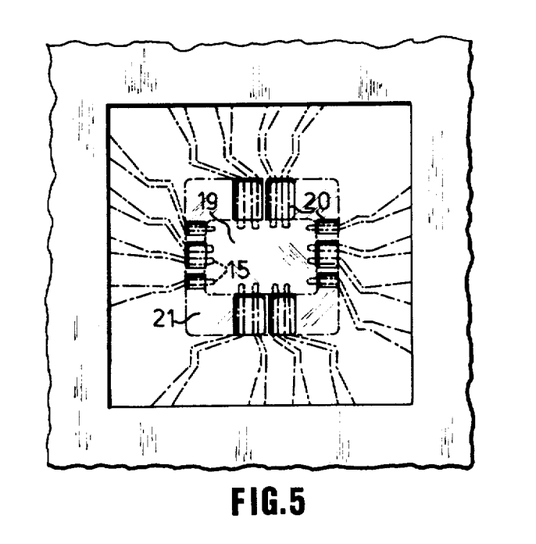
FIGS. 5 and 7 are variations of the embodiments shown in FIGS. 4 and 6, showing the appearance, at different stages, of each of the openings in the strip of FIG. 2 when the strip is processed in accordance with the invention, before the conductive film has been cut away.

FIG. 5 shows the appearance of one of the openings in the strip once the areas of lacquer in question have been removed. It can be seen from FIG. 5 that the regions of the film which are bared in each opening are portions 20 of an open-centered zone 21 which, to make the explanation clearer, may be imagined as having been traced out on the surface of the film when coated with the photosensitive lacquer. This open-centered zone 21 is so situated that the portion 19 of the film which it encloses is precisely that portion in which the free inner ends 15 of the interface conductors associated with this opening will subsequently be formed. In FIG. 5 the outlines of the future interface conductors are shown in dash-dot lines. It should be noted that, as FIG. 5 shows, the regions 20 where the film is bared are located at the points where the open-centered zone 21 is crossed by the outlines of the future interface conductors. There is however no disadvantage in the parts of the open-centered zone 21 which are situated away from these points being similarly bared, in which case, as can be seen in FIG. 5, each region 20 could extend over the outlines of a plurality of interface conductors, especially in cases where the outlines are relatively close together. It is even possible for the whole of the open-centered zone 21 to be bared, as in the case of the modification shown in FIG. 4.

Having thus been partly bared, the film 13 is then subjected to a surface preparation treatment using an acid bath.

Film 13 is then rinsed in running water. After this, the bared regions of the film are covered by electrodeposition with a layer of synthetic resin, the resin being selected, as mentioned above, from the group consisting of the polytetrafluorethylenes and the epoxy resins. It is deposited from a colloidal suspension of the resin in an aqueous medium, the acid index number of the resin being other than zero. In cases where the resin used for covering is an epoxy resin, it is electrodeposited from a colloidal suspension of a partly esterified epoxy resin in an aqueous medium. Thus, in the example described, the resin used to cover the bared regions of the film is one obtained by electrodeposition from the colloidal suspension which is sold in France by the French Duco Company under the name "Vernis electrocoat LEE 26,584" (registered trade mark), the epoxy index number of this resin being 1140 and its acid index number of the order of 35.

The resin is deposited by continuously moving the strip covered with its partly bared film through a vessel containing a bath of resin produced by diluting the above-mentioned colloidal suspension with water. In the course of its travel through the vessel, the strip is completely submerged in the bath of resin. To enable the resin to be deposited on the regions of the film which have been laid bare, there is provided an electrode dipping in the bath which is connected to the negative terminal of a DC voltage source, the film being connected to the positive terminal of the same source. The deposition of the resin takes place at a constant temperature with a constant difference of potential, and for a predetected length of time as will be hereinafter described.

The way in which this deposit forms can be explained by assuming that during the deposition process the concentration of the OH⁻ ions which result from the breakdown of the water decreases in the neighbourhood of the anode, thus giving rise to a relative increase in the concentration of H⁺ ions around the anode. This increase in H⁺ ions is accompanied by a lowering of the pH level of the bath in the vicinity of the anode, with the result that when the pH level becomes equal to a critical level the resin flocculates. It is for this reason that the commercially available colloidal suspensions used for electrodepositing epoxy resins all have a pH value higher than the pH of flocculation of the resin which they are used to produce. Thus the pH of the "Vernis electrocoat LEE 26584" colloidal suspension mentioned above is in the neighbourhood of 7.5 while pH at which the epoxy resin in the suspension flocculates is in the neighbourhood of 6. By diluting the above colloidal suspension with water, a resin bath is obtained whose pH depends on the degree of dilution which takes place. Thus, the pH of a bath of resin which is formed using the following proportions:

"Vernis electrocoat LEE 26584" . . . 1 volume

Demineralised water . . . 3 volumes is in the region of 7.45. Similarly, by further diluting the same suspension it is possible to obtain a resin bath whose pH is less than 7.45, the pH level tending towards 7 as the degree of dilution becomes very large. It should however be pointed out that the pH of the bath of resin which is obtained by diluting the "Vernis electrocoat LEE 26584" suspension with water may be altered by adding to the bath either soda, to raise the pH, or hydrochloric acid to lower it. In this way, if the suspension mentioned is used to deposit the resin, its pH is adjusted to a level between 7 and 12.

Figure 11:
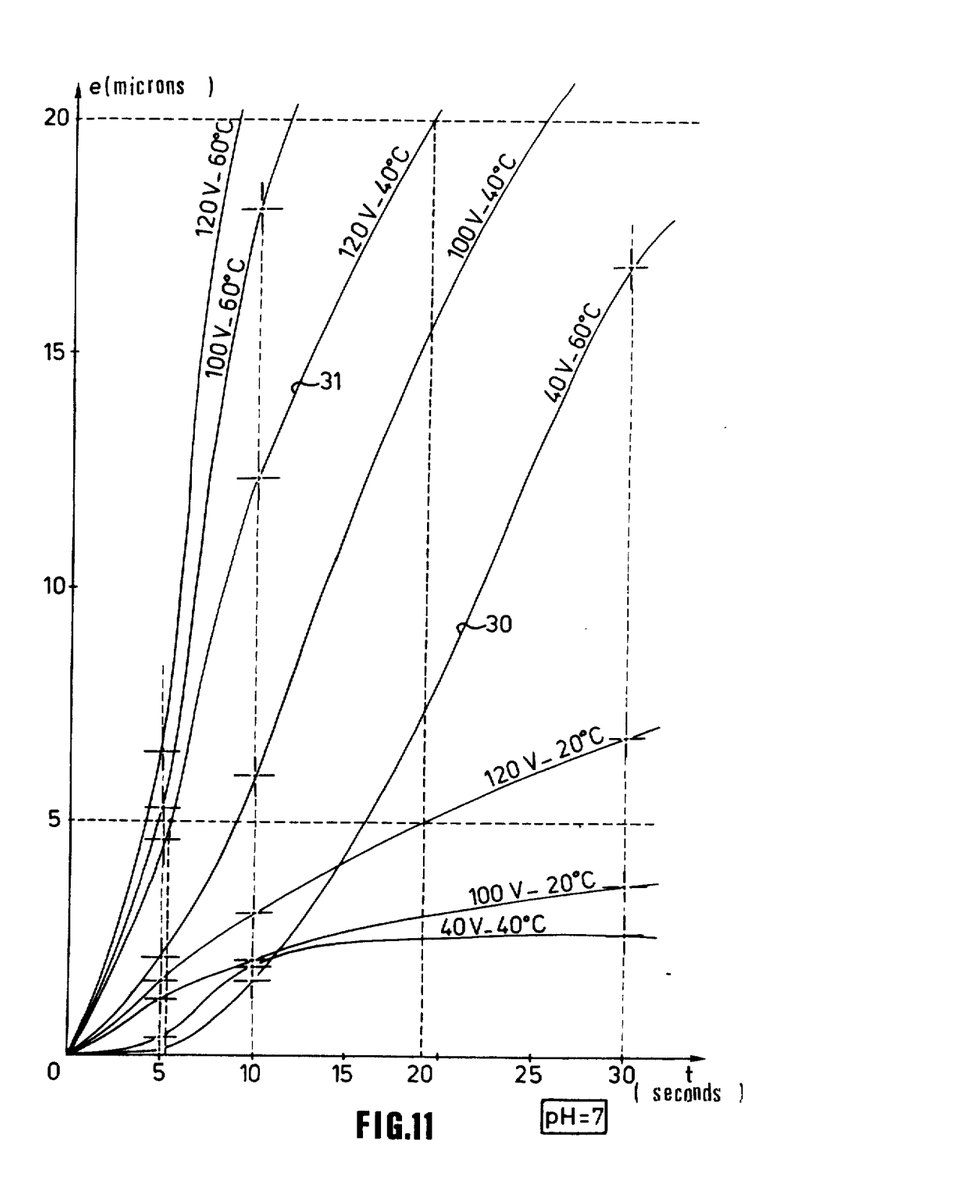
FIGS. 11 and 12 are graphs showing the change in the thickness of the resin layer which is electro-deposited on the conductive film, as a function of deposition time and the various operating procedures which are employed for the deposition.
Figure 12:
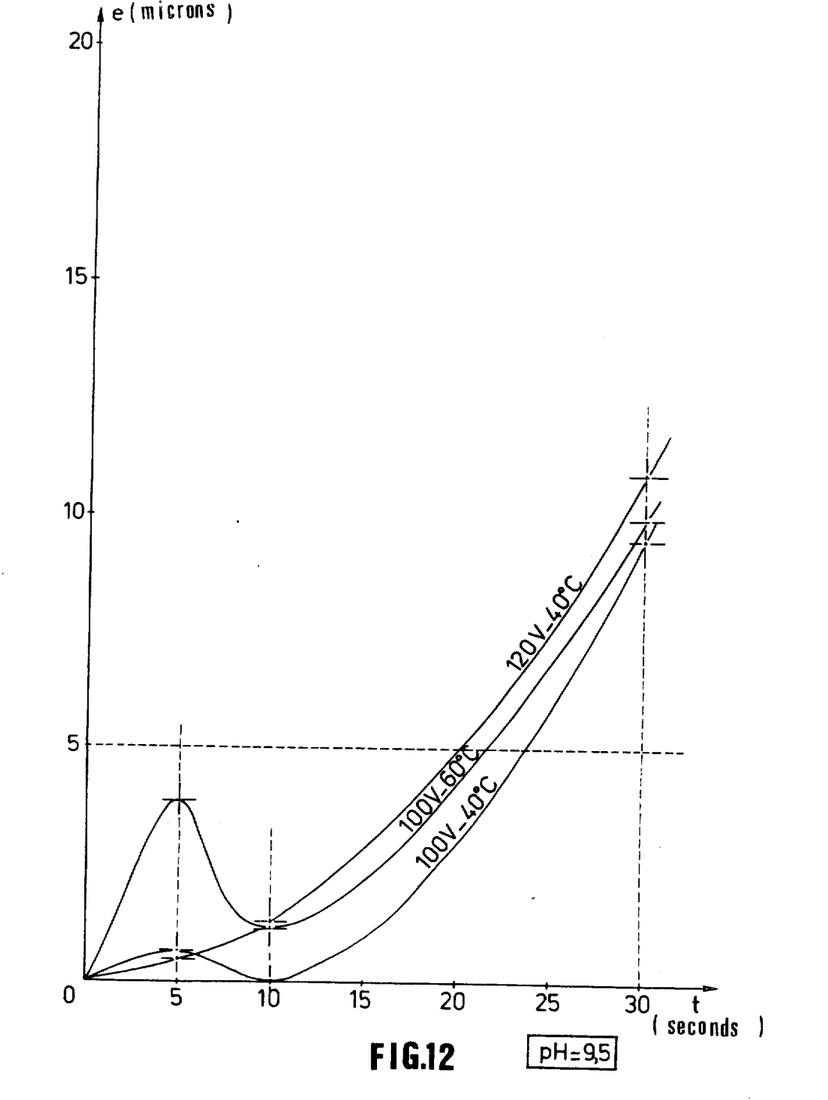

As was mentioned above, the resin is deposited on the regions of the film which have been bared by immersing the strip in the bath of resin for a given time, this time being calculated, in a way which will now be explained, as a function of the temperature of the bath, the pH of the bath, the potential difference applied between the electrodes, and the thickness of resin which is to be deposited on the film, which thickness should be between five and twenty microns. The length of time which allows a thickness of resin which meets this requirement to be obtained may easily be found from curves showing the change in thickness of the electrodeposited resin as a function of the deposition time, the pH of the bath, its temperature, and the potential difference applied between the electrodes, for a given surface area. These curves, certain of which are shown by way of example in FIGS. 11 and 12, are empirical curves which were originally plotted point by point as follows.

Using a resin bath of given pH at a given temperature, and operating with a given potential difference and for a given length of time, a layer of epoxy resin is deposited on a first sample of a conductive film of the same kind as that from which film 13 is formed. The thickness of the layer so deposited is then measured, the measurements being made by first determining the mass of the electrodeposited resin by weighing, then calculating the volume of the resin by dividing the measured mass by the specific mass of the resin, and finally calculating the thickness by dividing the volume so obtained by the area of the sample on which the resin has been deposited.

A layer of epoxy resin is then deposited on a second sample of a conductive material of the same kind as previously, using the same bath under the same conditions as before, but for a different length of time. The same method is then used to measure the thickness of the layer of resin so deposited. By thus carrying out a series of experiments, using a different length of time in each instance with the other operating conditions remaining unaltered, the thicknesses which correspond to given lengths of time are able to be determined. It is thus possible to plot point by point a curve for the changes in the layer of resin as a function of length of time, this curve applying to a bath of given pH at a given temperature and to a given potential difference. Thus, as an example, the curve marked 30 in FIG. 11 represents the change in the thickness of the layer of epoxy resin as a function of time, when the bath of resin used to deposit the layer is of the following composition:

Vernis electrocoat LEE 26584 . . . 1 volume

Demineralised water . . . 3 volumes and when the pH of this bath has been adjusted to 7 by adding hydrochloric acid, the temperature of the bath is maintained at 60° C., and the resin is deposited with a difference of potential of 40 volts.

For reasons of simplicity, the curves shown in FIG. 11 relate solely to the resin bath whose composition has just been given and whose pH has been adjusted to 7. In FIG. 12 other curves are shown which relate to the same bath of resin, but with the difference that in this case the pH of the bath is adjusted to 9.5. The operating conditions, i.e. the temperature of the bath and the value of the potential difference between the electrodes, are given by the side of each of the curves to allow the curves to be found subsequently when the method is applied.

Knowing the pH of the bath, it is possible to determine from the curves so obtained all the operating conditions which need to be adopted in order to obtain a layer of resin between five and twenty microns thick on the bared regions of the film. For this purpose it is merely necessary to extract from the set of curves relating to the given pH value that curve which corresponds to the temperature and potential difference which it is proposed to use, and to note the two limiting values between which the length of time required to deposit the resin layer must lie. These limiting values are given by the abscissa values for the points at which the curve in question intersects the ordinate lines representing thicknesses of five and twenty microns. Thus, as an example, it can be seen that if the pH of the resin bath used is 7 and if the working potential difference is 120 volts with the bath being held at a temperature of 40° C (curve 31 in FIG. 11), the strip will need to be immersed in the bath for a length of time of between 5.5 and 19 seconds. In the example described, the pH of the resin bath employed has been adjusted to 7 and the resin layer is deposited with a potential difference of 120 volts at a temperature of 40° C, the strip being immersed in the bath for around ten seconds. A layer of resin of a thickness of the order of 12 microns is obtained in this way on the previously bared regions of the film.

Figure 6:
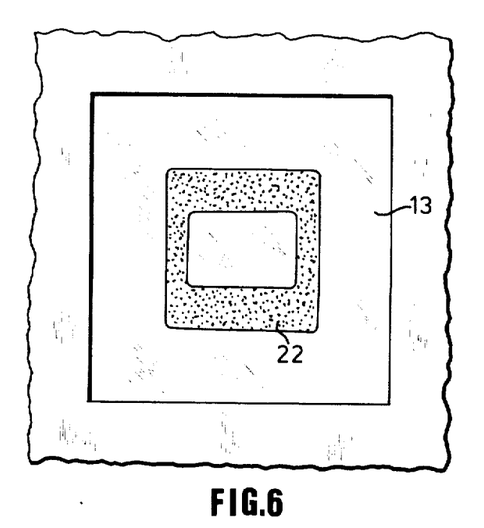
Figure 7:
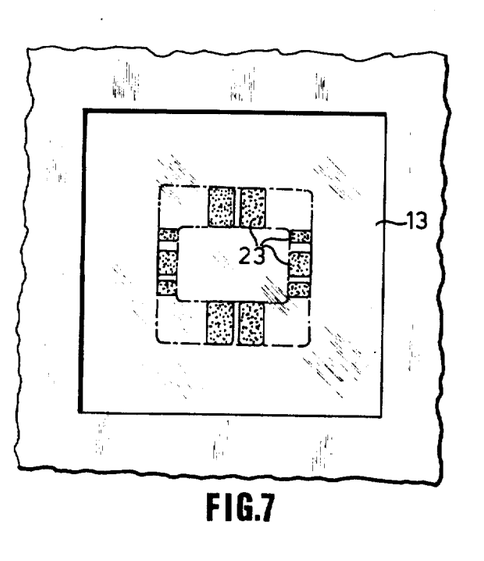

The strip, covered with its film which is in turn covered locally with the layer of resin, then has the lacquer removed from it by immersing it in boiling isopropanol for two minutes. After drying, the layer of resin is polymerised by passing the strip under a source of infrared radiation. The appearance of each of the openings in the strip at this stage is illustrated in FIGS. 6 and 7, the portion of film 13 which appears in the opening concerned showing itself now to be covered with a layer of resin which takes the form either of an open-centered zone 22 (FIG. 6), or of small areas 23 (FIG. 7) which form part of the same open-centered zone, the form of the layer of resin depending on whether the film has been laid bare in the opening over the whole of the open-centered zone or over only certain parts of it.

The film is then subjected to rinsing in acid, in the same way as described previously. It is then coated with a layer of photosensitive lacquer, which layer is then dried and exposed through a mask which bears a design corresponding to the interface conductors to be produced on the strip. After this, the exposed parts of the lacquer are dissolved and the portions of the film so bared are engraved with a solution of ferric perchloride. This photo-engraving operation is performed on the face of the film which is not attached to the strip. By this means it is possible to obtain interface conductors which, as shown in FIG. 3, are partly attached to the strip and partly overhang into one of the openings in the strip.

Figure 8:
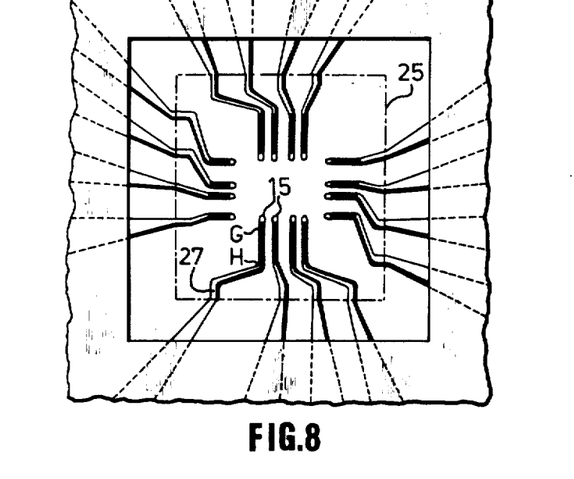
FIG. 8 shows the appearance of the interface conductors on a strip which has been processed in accordance with the invention.

FIG. 8 shows the appearance of the interface conductors when only their overhanging portions are visible after the strip has been turned over. Given that before the photo-engraving operation the resin was located at least on those portions of the open-centered zone 21 which were crossed by the outlines of the interface conductors, each of these interface conductors is thus covered for part of its length by a layer of resin. In FIG. 8 these covered portions of the interface conductors are shown in black. As shown in FIG. 8, a line 25 drawn in chain or dark lines will be seen in it. This line 25 is that on which the interface conductors are cut when the chip which has previously been attached to these conductors is detached so as to be mounted on a substrate. The portions of the conductors which remain attached to the chip following the cutting operation are thus the portions lying between the inner ends 15 of the conductors and line 25.

Each interface conductor has a zone 27 termed the contact zone. This zone is situated along the portion of the conductor which remains attached to the chip after cutting and it is located near line 25. It is these contact zones 27 which, as can be seen in FIGS. 9B and 9C, are intended to be soldered to the conductive areas on the substrate. Referring again to FIG. 8, it can be seen that the part of each interface conductor which is covered with synthetic resin extends between a point G near its inner end 15 and a point H which is situated between point G and the contact zone 27 of the conductor.

Figure 10:
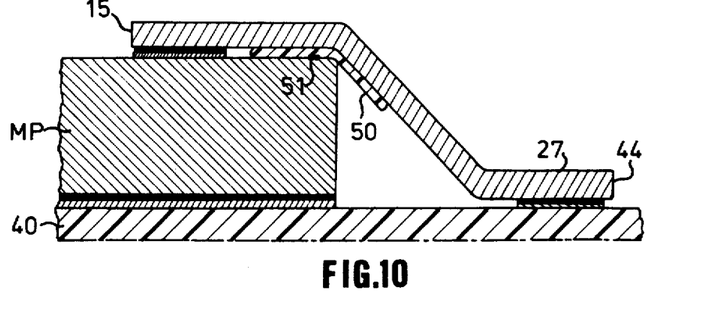
FIG. 10 is fragmentary cross-section through part of a substrate showing the shape assumed by one of the interface conductors attached at one end to an integrated circuit chip and soldered at its other end to one of the conductive areas on the substrate.

FIG. 10 shows the shape assumed by one of the interface conductors attached to a chip MP when, having been detached from the strip, the chip is mounted on a substrate 40 and the contact zones 27 of the conductors on it are soldered to the conductive areas on the substrate. It can thus be seen from this Figure that the layer 50 of synthetic resin which has been deposited on the conductor concerned extends at least over that part of the conductor which extends above the chip so that when the contact zone 27 of this conductor has been soldered to one of the conductive area on substrate 40, layer 50 prevents any electrical contact taking place between the conductor and the edge 51 of the chip. It is in fact known that the material situated beneath the contact studs on the chip is of a type which has a given conductivity, such as phosphorus doped silicon, whereas that situated along the edges of the chip is formed by silicon.

It should be noted that the resin layer which is electrodeposited on the interface conductors associated with the strip has the advantage not only that it removes the danger of short-circuits arising from the conductors coming into contact with the edges of the chips to which they are soldered, but also that it will withstand without suffering damage, all the mechanical, chemical and heat treatments to which the strip is subjected after the layer has been applied. Furthermore, examination under the electron microscope showed that the layer contained no microfractures, even after the conductors on which it was deposited had been soldered to the conductive areas on the substrate, and that its mechanical and electrical properties had therefore not been adversely affected.

What we claim is:

1. A method of fabricating a carrier support for integrated circuit chips to be mounted subsequently on a substrate, comprises coating a flexible strip of an inextensible insulating material having equidistant openings in the center of each of which a chip is to be mounted and a conductive film on one of the faces of the strip with a layer of photosensitive lacquer on the film, partly removing the said photosensitive layer to bare the film in selective regions, electrodepositing a layer of synthetic resin on the bared regions of the film, removing the remaining portions of the photosensitive lacquer and cutting away the said film to form in each opening interface conductors which overhang towards the center of the opening.

2. A method according to claim 1, wherein the synthetic resin which is electrodeposited on the bared regions of the film is a resin from the group consisting of the polytetrafluoroethylenes and the epoxy resins.

3. A method according to claim 2, wherein the resin is deposited on the bared regions of the film by immersing the film in an aqueous suspension of a resin whose acid number is other than zero, said resin being deposited at a substantially constant temperature, with a substantially constant potential difference, and for a length of time lying between two limiting values at which the thickness of the electrodeposited layer is 5 and 20 microns.

4. A method according to claim 3, wherein the suspension used is a colloidal suspension of epoxy resin having an epoxy number of the order of 140 and an acid number of the order of 35.

5. A method according to claim 4, wherein the pH of the suspension is adjusted to a value between 7 and 12.

6. A method according to claim 4, wherein the pH of the suspension is adjusted to 7 and in that the resin is deposited at a temperature of 40° C with a potential difference of 120 volts and for a length of time of between 5.5 and 19 seconds.

7. A method according to claim 3, wherein further including determining said limiting values by plotting curves showing the change in thickness of the deposited resin layer as a function of time for the pH of the suspension and for the selected temperature and potential difference.

8. A method of fabricating a carrier support for integrated circuit chips to be mounted subsequently on a substrate, comprises coating a flexible strip of an inextensible insulating material having equidistant openings in the center of each of which a chip is to be mounted and a film of a conductive substance on one of the faces of the strip with a layer of photosensitive lacquer on the film, partly removing the said photosensitive layer to enable the film to be laid bare in regions which, in each opening, form part of an open-centered zone which surrounds that portion of the film in which the free inner ends of the interface conductors associated with this opening are to be produced, the bared regions in this opening either consisting of the whole of the said open-centered zone or else consisting of those portions of the zone which are located at least at the points where the said zone is crossed by the outlines of the future interface conductors associated with this opening, electrodepositing a layer of synthetic resin on the regions of the film so bared, removing the remaining portions of the photosensitive lacquer and cutting away the said film to form in each opening interface conductors which overhang towards the center of the opening.

9. A method according to claim 8, wherein the synthetic resin which is electrodeposited on the bared regions of the film is a resin from the group consisting of the polytetrafluoroethylenes and the epoxy resins.

10. A method according to claim 9, wherein the resin is deposited on the bared regions of the film my immersing the film in an aqueous suspension of a resin whose acid number is other than zero, said resin being deposited at a substantially constant temperature, with a substantially constant potential difference, and for a length of time lying between two limiting values determined by plotting curves which show the change in the thickness of the deposited resin layer as a function of time for the pH of the suspension and for the selected temperature and potential difference, these limiting values being those at which the thickness of the electrodeposited layer is 5 and 20 microns respectively.

11. A method according to claim 10 the suspension used is a colloidal suspension of epoxy resin having an epoxy number of the order of 140 and an acid number of the order 35.

12. A method according to claim 11, wherein the pH of the suspension is adjusted to a value between 7 and 12.

13. A method according to claim 11, wherein the pH of the suspension is adjusted to 7 and in that the resin is deposited at a temperature of 40° C with a potential difference of 120 volts and for a length of time of between 5.5 and 19 seconds.

* * * * *